(12) United States Patent
Shimizu

(10) Patent No.: US 8,461,638 B2
(45) Date of Patent: Jun. 11, 2013

(54) NON-VOLATILE SEMICONDUCTOR MEMORY DEVICE

(75) Inventor: Masakuni Shimizu, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/073,493

(22) Filed: Mar. 28, 2011

(65) Prior Publication Data

US 2011/0233649 A1  Sep. 29, 2011

(30) Foreign Application Priority Data

Mar. 29, 2010 (JP) ................... 2010-076198

(51) Int. Cl.
*H01L 29/76* (2006.01)
*G11C 11/34* (2006.01)

(52) U.S. Cl.
USPC ............... 257/314; 257/E29.309; 365/182

(58) Field of Classification Search
CPC ............ H01L 21/28273; H01L 27/115; H01L 27/11521; G11C 16/0475; G11C 11/404; G11C 11/412
USPC ............. 257/314, 324, E29.309; 365/174, 365/182, 183
See application file for complete search history.

(56) References Cited

U.S. PATENT DOCUMENTS

| 6,653,685 | B2 * | 11/2003 | Katayama et al. | 257/324 |
|---|---|---|---|---|
| 7,132,718 | B2 | 11/2006 | Hisamoto et al. | |
| 7,671,404 | B2 | 3/2010 | Hisamoto et al. | |
| 2004/0119107 | A1 | 6/2004 | Hisamoto et al. | |
| 2007/0040208 | A1 | 2/2007 | Hisamoto et al. | |
| 2007/0155153 | A1 * | 7/2007 | Okazaki et al. | 438/597 |
| 2010/0135080 | A1 | 6/2010 | Hisamoto et al. | |

FOREIGN PATENT DOCUMENTS

| JP | 2004-186452 | 7/2004 |
|---|---|---|
| JP | 2005-142354 | 6/2005 |

\* cited by examiner

*Primary Examiner* — Nikolay Yushin
(74) *Attorney, Agent, or Firm* — Young & Thompson

(57) ABSTRACT

A non-volatile semiconductor memory device includes: a charge accumulation layer (CAL) on a substrate; a memory gate formed onto the substrate through the CAL; a first side gate formed through a first insulating film on a first side of the memory gate; a second side gate formed through a second insulating film on a second side opposite to the first side; a first impurity implantation region (IIR1) in the substrate adjacent the first side gate; a second impurity implantation region (IIR2) formed in the substrate on a side of the second side gate; and a channel region between IIR1 and IIR2. The channel region includes a first region corresponding to a boundary between the CAL and the substrate; a select side region between the first region and IIR1; and an assist side region between the first region and IIR2. The select side region is longer than the assist side region.

11 Claims, 18 Drawing Sheets

| | SG | | MG | | AG | | BL | | SL | |
|---|---|---|---|---|---|---|---|---|---|---|
| | sel | unsel | sel | unsel | sel | unsel | sel | unsel | sel | unsel |
| READ | 1.2V | 0V | 1.2V | 0V | 2V | 0V | 1.2V | 0V | 0V | 0V |
| WRITE | 2V | 0V | 0.5V | 0V | 2V | 0V | 0V | 2.5V | 5V | 0V |
| ERASE | 0V | 0V | -2V | 0V | -2V | 0V | 0V | 0V | 5V | 0V |

NON-VOLATILE SEMICONDUCTOR MEMORY DEVICE

CROSS-REFERENCE TO RELATED APPLICATION

This patent application claims a priority on convention based on Japanese Patent Application No. 2010-076198 filed on Mar. 29, 2010. The disclosure thereof is incorporated herein by reference.

BACKGROUND

The present invention relates to a non-volatile semiconductor storage device, and more particularly, to a non-volatile semiconductor memory device having a charge trapping layer.

As one of memory devices configured as semiconductor integrated circuits, there is a non-volatile semiconductor memory device. The non-volatile semiconductor memory device contains an element in which a memory data retains even if a power supply is powered off. As one example of a conventional non-volatile semiconductor memory device, a memory device containing a floating gate (FG) (hereafter, to be referred to as an FG-type memory device) is known. In the FG-type memory device, a threshold voltage for a read current is changed in accordance with charges accumulated in the floating gate. The-FG type memory device stores the data based on the threshold voltage.

In accompaniment with a request of a very fine structure for the non-volatile semiconductor memory device and a request of matching to a CMOS LSI process, the non-volatile semiconductor memory device is required in which a finer structure is easily formed as compared with the FG-type memory device. As such a non-volatile semiconductor memory device, the non-volatile semiconductor memory device (Patent Literature 1) is known which uses the trapping of charges in a charge accumulation layer contained in an insulating film (hereafter, to be referred to as a charge accumulation layer type memory device).

As one example of the charge accumulation layer type memory device, a MONOS type non-volatile semiconductor memory device is known which uses a MONOS (Metal Oxide Nitride Oxide Semiconductor) cell (Patent Literatures 1, 2). The MONOS cell contains two diffusion layers (Source/Drain Implant) that serve as a drain and a source, respectively, and a memory gate electrode provided through a memory gate insulating film on a channel region between the two diffusion layers. Also, a control gate (select gate) electrode is provided on the side of the memory gate electrode.

FIG. 1 is a sectional view showing a memory cell 101 described in Patent Literature 1. The technique described in Patent Literature 1 is intended to provide a non-volatile semiconductor memory device that has a write/erasure property with a high performance. With reference to FIG. 1, in the memory cell 101, a select gate 118 is formed through a gate insulating film 106 on a P-type well 102 of a semiconductor substrate. Also, on the P-type well 102, a memory gate 117 is formed through a lamination film 115 of a silicon oxide film 115a, a silicon nitride film 115b and a silicon oxide film 115c. The memory gate 117 is adjacent to the select gate 118 through the lamination film 115. An n-type impurity diffusion layer 120 and an n-type impurity diffusion layer 121, which respectively serve as a source and a drain, are formed in regions on both sides of the P-type well 102, namely, on the select gate 118 and the memory gate 117. In a channel region located between the impurity diffusion layer 120 and the impurity diffusion layer 121, impurity concentrations are different between a region 151 that can be controlled by the select gate 118 and a region 152 that can be controlled by the memory gate 117.

The technique described in Patent Literature 1 allows SSI (Source Side Injection) whose write efficiency is excellent. Also, at a time of erasure, a voltage difference is generated between the source diffusion layer and the memory gate to achieve hot hole erasure using BTBT (Band To Band Tunneling). By achieving the hot hole erasure, the technique described in Patent Literature 1 can suppress a use voltage to a low voltage, as compared with a technique in which electrons are pulled out through the use of FN-Tunneling.

FIG. 2 is a sectional view showing a memory cell 200 described in Patent Literature 2. The technique described in Patent Literature 2 is intended to provide a non-volatile semiconductor memory device in which a manufacturing process is easy, a high integration is possible, a property is stable even if a write operation, a read operation and an erase operation are repeated, and an occupation region can be reduced so as to be suitable for a higher performance, and a method of driving the same, and a method of manufacturing the same.

With reference to FIG. 2, the memory cell 200 contains a charge retention film 204, which is laminated on a semiconductor substrate 201 and has a charge retention function. The charge retention film 204 contains a bottom silicon oxide film 204-1, a charge capturing film 204-2 and a top silicon oxide film 204-3. Also, this contains a memory gate electrode 205 formed through the charge retention film 204 on the semiconductor substrate 201. A sidewall gate electrode 207a is insulated from the memory gate electrode 205 by a silicon oxide film 206a, and a sidewall gate electrode 207b is insulated from the memory gate electrode 205 by a silicon oxide film 206b, and the sidewall gate electrode 207a and the sidewall gate electrode 207b are formed on both sides of the memory gate electrode 205. Also, the memory cell 200 has a source impurity diffusion layer 202 adjacent to the sidewall gate electrode 207a and a drain impurity diffusion layer 203 adjacent to the sidewall gate electrode 207b, inside the semiconductor substrate 201.

In the memory cell 200, a semiconductor substrate surface region between the source impurity diffusion layer 202 and the drain impurity diffusion layer 203 becomes a channel region in which a channel of a memory transistor is formed at a time of an operation. The channel region is composed of an inner channel region Ch2 formed on the substantial center thereof, an outer side channel region Ch1 between the inner channel region Ch2 and the source impurity diffusion layer 202, and an outer channel region Ch3 between the inner channel region Ch2 and the drain impurity diffusion layer 203. The inner channel region Ch2 is formed such that a P-type impurity concentration is lower than those of the outer channel region Ch1 and the outer channel region Ch3.

In the technique described in Patent Literature 2, the charge retention film 204 is used under the central memory gate electrode 205, and the electrodes on the sidewalls of both sides (the sidewall gate electrode 207a and the sidewall gate electrode 207b) are used as a selection transistor. In the technique described in Patent Literature 2, each of a memory section 204a and a memory section 204b is used as one memory section. The source impurity diffusion layer 202 and the drain impurity diffusion layer 203 are used while the roles as the drain and the source are switched on the basis of the bit of the memory section 204a or 204b which is read. Both of the electrodes on the sidewalls of both sides (the sidewall gate electrode 207a and the sidewall gate electrode 207b) must function as the selection transistor. For this reason, the outer channel region Ch1 and the outer channel region Ch3 require Leff (effective channel length) under which off leakage can be sufficiently suppressed.

In the memory cell 200 described in Patent Literature 2, even if the hot hole erasure is tried, it is difficult for the generated hole to arrive at the charge retention film 204. For this reason, the technique described in Patent Literature 2 attains the erasure by applying a high voltage to the memory gate electrode 205 and pulling out the electrons through the use of the FN-Tunneling.

CITATION LIST

[Patent Literature 1]: JP 2004-186452A
[Patent Literature 2]: JP 2005-142354A

SUMMARY OF THE INVENTION

As one of problems related to the retention property of the non-volatile semiconductor memory device which is represented by the MONOS cell and uses charge traps, a trouble caused by uneven distributions between the electrons and the holes is known. Also, there is a difference of a physical position distribution between the injected electrons and holes. Thus, there is a case that all of them cannot be re-coupled by the injection of carriers resulting from the write or erase operation, and they remain with a physical position distribution. Such a trouble is referred to as "Mismatching". In this specification, hereinafter, the term of "Mismatching" is used in this meaning.

In the memory cell 101 described in Patent Literature 1, the gate and the diffusion layer are required to be sufficiently close to each other, in order that the BTBT generated by electric field between the gate and the diffusion layer at the time of erasure is made efficient. Thus, the impurity diffusion layer 120 is formed to have a portion overlapping with the lamination film 115. In a case of such a structure, there is a possibility that the above "Mismatching" is generated because the holes entering the overlapping portion at the time of erasure cannot be re-coupled to the electrons at the time of write. Thus, the entering charges (holes) are accumulated while the write and erasure operations are repeated. The accumulated charges are diffused in a lateral direction with the elapse of time, and consequently, changes a charge distribution in the lamination film 115. Especially, the gross charge quantity near the source is changed although it has great influence on the threshold voltage of the memory cell. As a result, the degradation in the retention property occurs such that it is difficult to read data, or the data is broken.

Also, in the memory cell 101 described in Patent Literature 1, the insulation between the select gate 118 and the memory gate 117 is achieved by the lamination film 115. The lamination film 115 between the select gate 118 and the memory gate 117 is separated from the end of the diffusion layer in which the hot holes are generated for the sake of the erasure. Moreover, the lamination film 115 between the select gate 118 and the memory gate 117 is close to the region in which hot electrons are generated in the write operation of SSI. The electron, which enters the lamination film 115 between the select gate 118 and the memory gate 117 at the time of the write operation, is re-coupled with the hole at the time of the erase operation due to the difference of the generation position between the hot electron and the hot hole as mentioned above. Thus, the repetition of the write and erase operations causes the electrons to be accumulated in this portion. These electrons are also moved inside the lamination film 115 serving as the charge accumulation layer with the elapse of time and may change the charge distribution and may degrade the retention property, as described above.

Also, in the structure of the memory cell 200 described in Patent Literature 2, it is difficult to carry out the hot hole erasure. In order to carry out the hot hole erasure, the source diffusion layer and the charge accumulation layer are required to be physically close to each other to a degree that the generated hole sufficiently arrives. In the structure of the memory cell 200 described in Patent Literature 2, the sidewall gates carry out the role as the selection transistor. For this reason, the effective channel length Leff is required to be long enough to suppress the off leakage. However, it is difficult to achieve those two requests at a same time.

For this reason, in the memory cell 200 described in Patent Literature 2, the high voltage is applied to the memory gate electrode 205, and the electrons are pulled out through the FN-Tunneling, and the erasure is consequently executed. In order to achieve the erasure through the FN-Tunneling, a peripheral circuit is required which generates a high voltage such that the charges inside the charge accumulation layer can be pulled out. A transistor serving as a component of the peripheral circuit requires: a diffusion layer impurity profile that can endure the high voltage; and a long gate length so that a punch through does not occur even when the high voltage is applied. In order to satisfy such constraints, it is required that the element (transistor) of the peripheral circuit is made large and the total region of the entire circuit including the peripheral circuit increases. Also, in the circuit having the element, there is a case that the circuit scale becomes large and the operation of a high speed becomes difficult.

Therefore, a subject of the present invention is to provide a technique for suppressing occurrence of the phenomenon referred to as mismatching and improving the retention property of a memory element.

In an aspect of the present invention, a non-volatile semiconductor memory device includes: a charge accumulation layer formed on a substrate; a memory gate formed onto the substrate through the charge accumulation layer; a first side gate formed through a first insulating film on a first side of the memory gate; a second side gate formed through a second insulating film on a second side opposite to the first side with respect to the memory gate; a first impurity implantation region formed in the substrate on a side of the first side gate; a second impurity implantation region formed in the substrate on a side of the second side gate; and a channel region formed between the first impurity implantation region and the second impurity implantation region. The channel region includes a first region corresponding to a boundary between the charge accumulation layer and the substrate; a select side region between the first region and the first impurity implantation region; and an assist side region between the first region and the second impurity implantation region. The length of the select side region is longer than a length of the assist side region.

In another aspect of the present invention, a manufacturing method of a non-volatile semiconductor memory device, is achieved by forming a memory gate on a substrate through a charge accumulation layer; by forming an insulating film to cover a surface of the substrate and a surface of the memory gate; by forming a conductive film to cover the insulating film; by etching back the conductive film to form a first side gate and a second side gate on side walls of the memory gate; by forming a first impurity implantation region in the substrate outside the first side gate to extend for a first distance from an end of the first side gate; by forming a second impurity implantation region in the substrate outside the second side gate to extend for a second distance, which is shorter than the first distance, from an end of the second side gate.

According to the present invention, it is possible to provide the technique that improves the retention property of the memory element which has the charge accumulation layer and uses the trapping of the charges.

BRIEF DESCRIPTION OF THE DRAWINGS

The above and other objects, advantages and features of the present invention will be more apparent from the following description of certain embodiments taken in conjunction with the accompanying drawings, in which.

DETAILED DESCRIPTION OF EMBODIMENTS

Hereinafter, a non-volatile semiconductor memory device according to the present invention will be described below in detail with reference to the attached drawings.

First Embodiment

Figure 1:
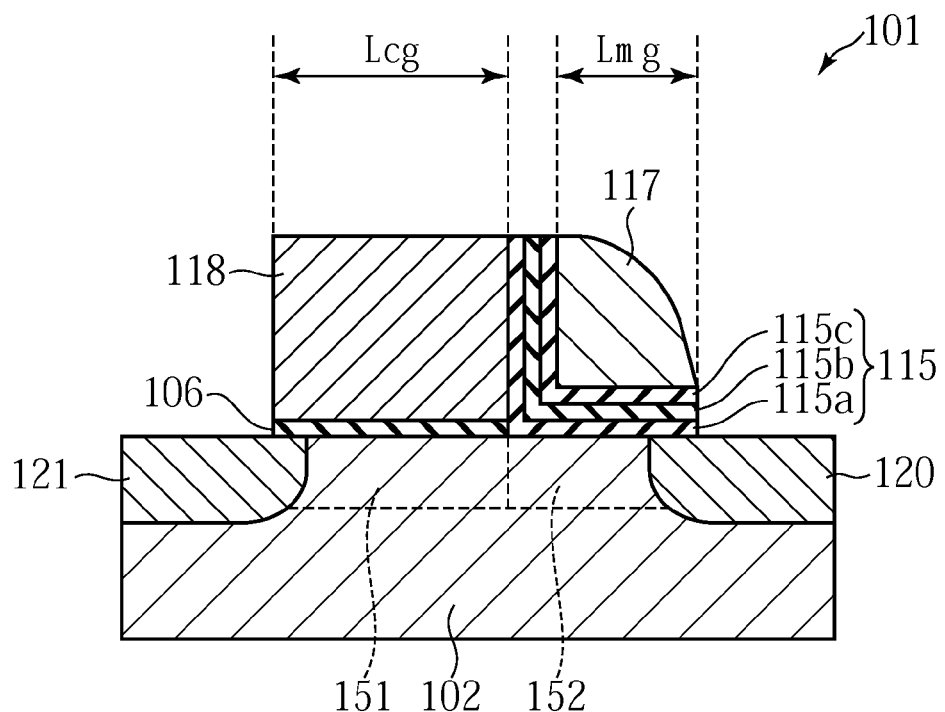
FIG. 1 is a sectional view showing a conventional memory cell.
Figure 2:
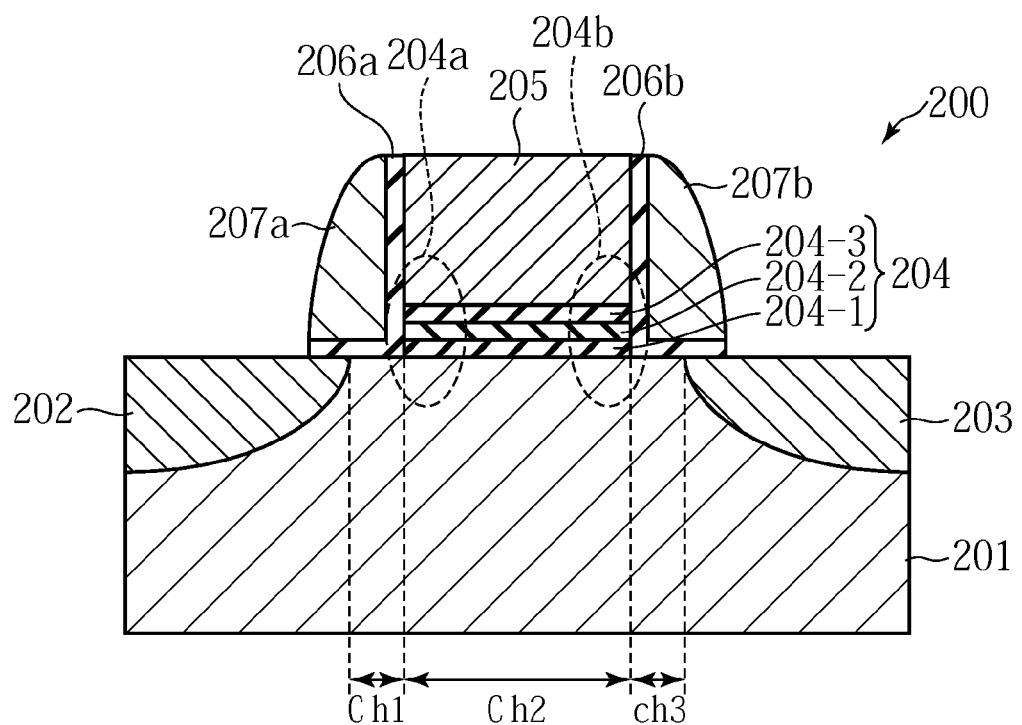
FIG. 2 is a sectional view showing a conventional another memory cell.
Figure 3:
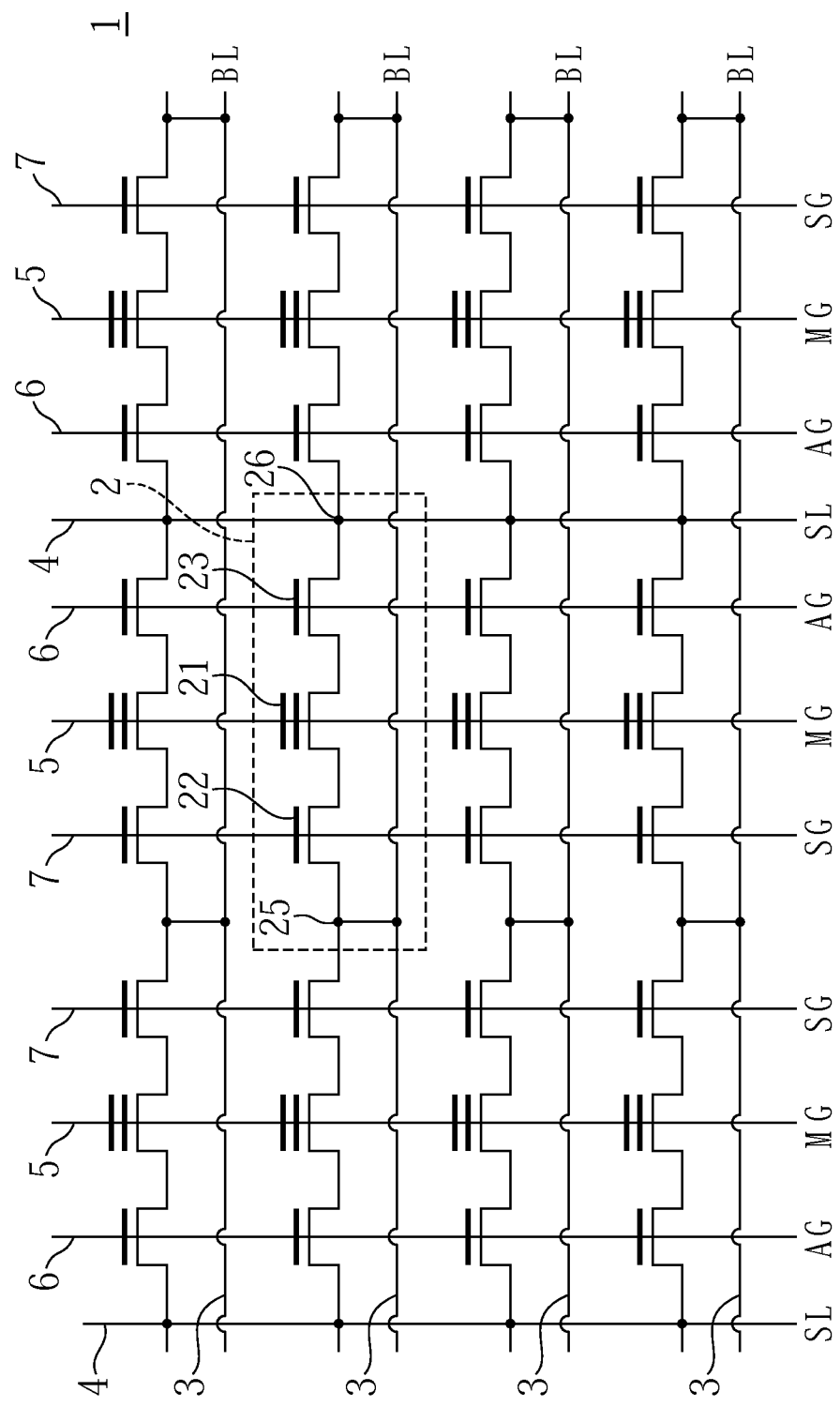
FIG. 3 is a circuit diagram showing a circuit configuration of a non-volatile semiconductor memory device according to a first embodiment of the present invention.

FIG. 3 is a circuit diagram showing the non-volatile semiconductor memory device according to a first embodiment of the present invention. The non-volatile semiconductor storage device 1 in the present embodiment contains a plurality of memory cells 2 arranged in an array. Also, the non-volatile semiconductor storage device 1 contains a plurality of bit lines 3 arranged parallel to each other. Moreover, the non-volatile semiconductor storage device 1 contains a plurality of source lines 4, a plurality of memory gate lines 5, a plurality of assist gate wirings 6 and a plurality of select gate lines 7. In this embodiment, the plurality of source lines 4, the plurality of memory gate lines 5, the plurality of assistant gate wirings 6 and the plurality of select gate lines 7 are arranged to intersect the bit lines 3. It should be noted that the circuit configuration shown in FIG. 3 does not limit an interconnection structure of the present embodiment.

With reference to FIG. 3, the memory cell 2 contains a memory gate 21, a select gate 22, an assist gate 23, a bit diffusion layer 25 and a source diffusion layer 26. The bit line 3 is connected to the bit diffusion layer 25 in the memory cell 2. Also, the source line 4 is connected to the source diffusion layer 26 in the memory cell 2. The memory gate line 5 is connected to the memory gate 21. The assist gate wiring 6 is connected to the assist gate 23. The select gate line 7 is connected to the select gate 22.

Figures 4, 5:
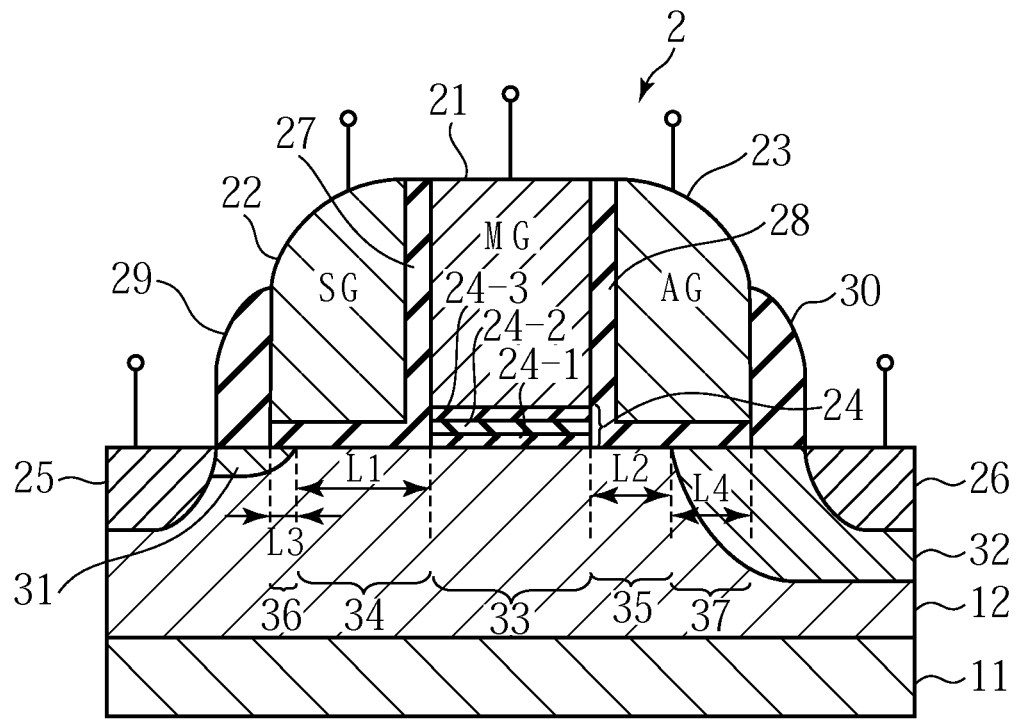
FIG. 4 is a sectional view showing the configuration of a memory cell in the first embodiment.
FIG. 5 is a table showing a voltage distribution in order to operate the memory cell in the first embodiment.

FIG. 4 is a sectional view showing the structure of the memory cell 2 in the present embodiment. In the present embodiment, the memory cell 2 is formed on a well 12 provided in a semiconductor substrate 11. As mentioned above, the memory cell 2 contains the memory gate (MG) 21, the select gate (SG) 22, the assist gate (AG) 23, the bit diffusion layer 25 and the source diffusion layer 26. The memory gate 21 is formed through a charge accumulation layer (ONO film) 24 on the well 12. The charge accumulation layer (ONO film) 24 includes a bottom silicon oxide film 24-1, a silicon nitride film 24-2 and a top silicon oxide film 24-3. In the present embodiment, preferably, the film thickness of an insulation film 28 is about 80 Å. Also, preferably, the film thickness of the bottom silicon oxide film 24-1 is about 40 Å, the film thickness of the silicon nitride film 24-2 is about 50 Å, and the film thickness of the top silicon oxide film 24-3 is about 40 Å.

The select gate 22 is formed adjacently to the memory gate 21 through an insulating film 27. The insulating film 27 extends to a region between the select gate 22 and the well 12.

The assist gate 23 is formed adjacently to the memory gate 21 through the insulating film 28. The insulating film 28 is extends to a region between the assist gate 23 and the well 12. A sidewall insulating film 29 is formed on the side of the select gate 22, and a sidewall insulating film 30 is formed on the side of the assist gate 23. The bit diffusion layer 25 is formed in the well 12 outside the sidewall insulating film 29 in a horizontal direction. The source diffusion layer 26 is formed in the well 12 outside the sidewall insulating film 30 in the horizontal direction.

With reference to FIG. 4, the memory cell 2 contains a first impurity implantation region 31 provided in the well 12, and a second impurity implantation region 32 provided in the well 12. The memory cell 2 contains an intermediate channel region 33, a select gate side channel region 34 and an assist gate side channel region 35 between the first impurity implantation region 31 and the second impurity implantation region 32.

The select gate side channel region 34 is a region provided in the lower portion of the select gate 22 and having the channel length of a first length L1. By the first length L1, Leff (effective channel length) is given to the select gate side channel region 34 to have length enough to suppress off-leakage. The assist gate side channel region 35 is a region provided in the lower portion of the assist gate 23 and having the channel length of a second length L2. The intermediate channel region 33 is a region provided in the lower portion of the memory gate 21, between the select gate side channel region 34 and the assist gate side region 35.

Also, the first impurity implantation region 31 includes a first overlap region 36 whose length is a third length L3. The first overlap region 36 is a part of the first impurity implantation region 31. The second impurity implantation region 32 includes a second overlap region 37 whose length is a fourth length L4. The second overlap region 37 is a part of the second impurity implantation region 32.

In the memory cell 2 of the present embodiment, preferably, a gate length of the select gate 22 is about 0.05 μm and a gate length of the assist gate 23 is about 0.05 μm. In this case, preferably, the first length L1 is about 0.045 μm, the second length L2 is about 0.01 μm, the third length L3 is about 0.005 μm, and the fourth length L4 is about 0.04 μm. Also, at that time, the length of the intermediate channel region 33 is preferred to be about 0.05 μm.

Thus, as shown in FIG. 4, in the memory cell 2 in the present embodiment, the channel region is formed to satisfy the following relation:

First Length L1>Second Length L2

Also, the first impurity implantation region 31 and the second impurity implantation region 32 are formed to satisfy the following relation:

Third Length L3<Fourth Length L4

FIG. 5 is a table showing a voltage distribution when the memory cell 2 operates in the present embodiment. A symbol "sel" shown in FIG. 5 shows the voltage distribution when the memory cell 2 serves as a selection bit. Also, a symbol "unsel" shows the voltage arrangement when the memory cell 2 serves as a non-selection bit. A voltage distribution table 38 in FIG. 5 includes a record 38-1, a record 38-2 and a record 38-3. The record 38-1 shows the voltage distribution when the data is read from the memory cell 2. The record 38-2 shows the voltage distribution when the data is written into the memory cell 2. The record 38-3 shows the voltage distribution when the data is deleted from the memory cell 2.

Figure 6:
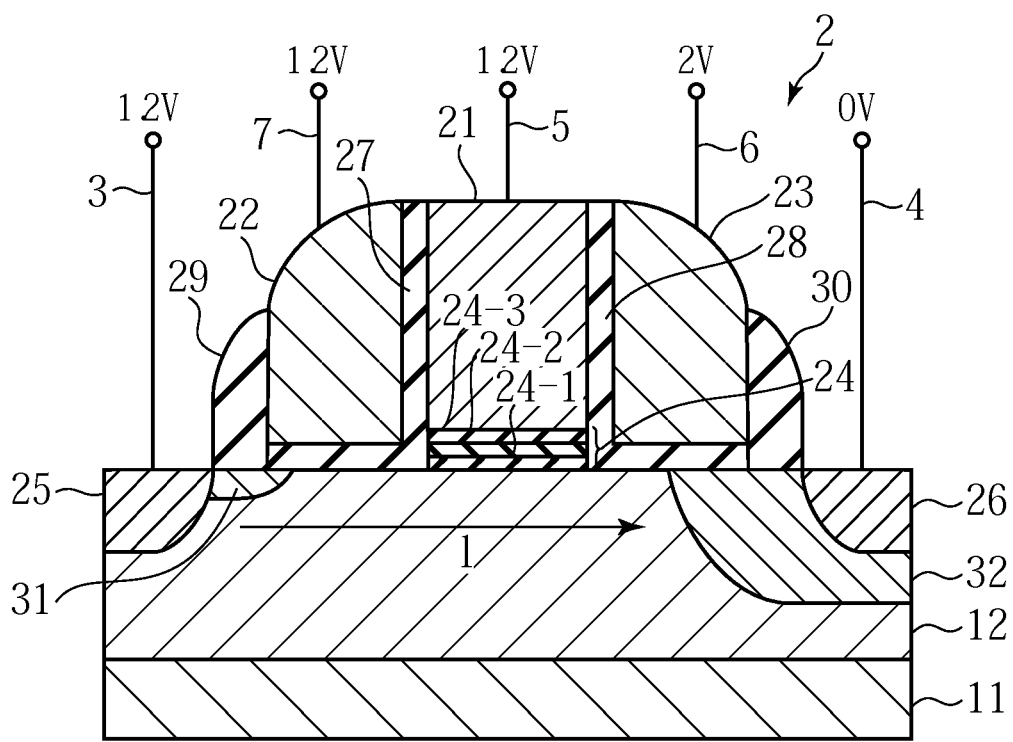
FIG. 6 is a view showing a configuration of the memory cell and a voltage distribution in a read operation in the first embodiment.

FIG. 6 is a diagram showing the configuration of the memory cell 2 in the present embodiment and the voltage distribution in a read operation. As shown in FIG. 6, when the read operation is executed, a voltage applied to each of the gate electrodes is controlled in accordance with the voltage distribution table 38. In the read operation, about 0V is applied to the source line 4, and about 1.2V is applied to the bit line 3. In this state, a threshold of the memory cell transistor is detected. When the negative charges are accumulated in the charge accumulation layer (ONO film) 24 (the silicon nitride film 24-2), the threshold increases as compared with a case that the negative charge is not accumulated. Thus, by detecting the threshold, it is possible to read the data written in the cell.

Figure 7:
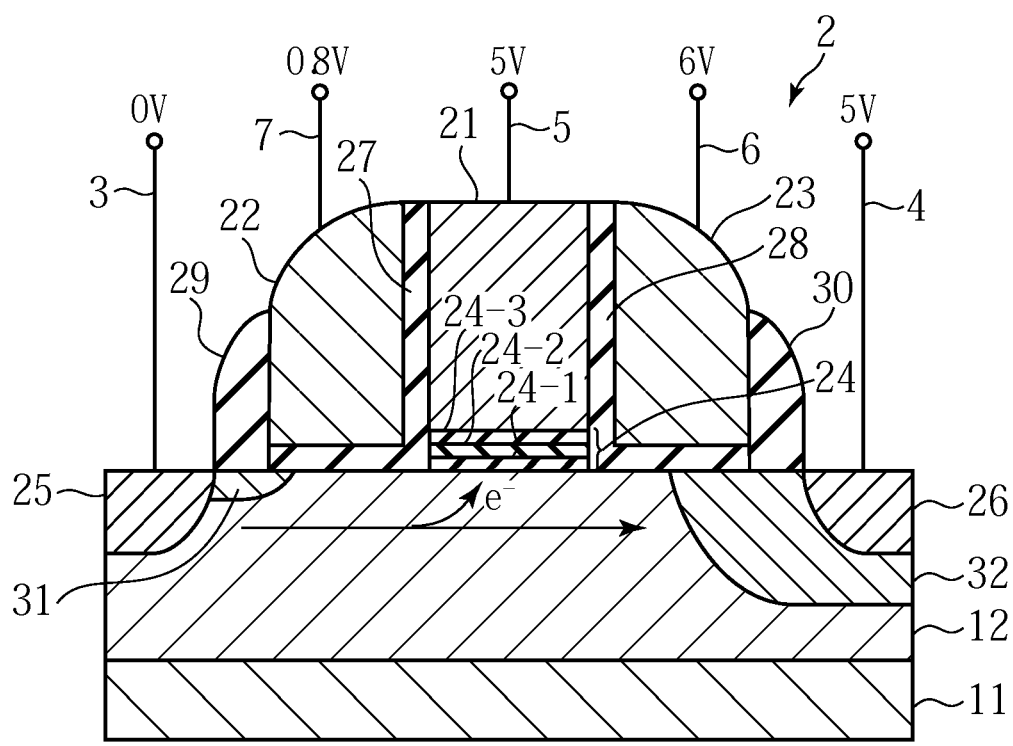
FIG. 7 is a view showing the configuration of the memory cell and a voltage distribution in a write operation in the first embodiment.

FIG. 7 is a diagram showing the configuration of the memory cell 2 in the present embodiment and the voltage distribution in a write operation. As shown in FIG. 7, when the write operation is performed, the voltage applied to each of the gate electrodes is controlled in accordance with the voltage distribution table 38. At the time of the write operation, the positive voltage of about 5V is applied to the source line 4, and about 0V is applied to the bit line 3. With reference to FIG. 7, hot electrons generated in the channel region are injected into the silicon nitride film 24-2 of the charge accumulation layer (ONO film) 24. This is referred to as a CHE (Channel Hot Electron) injection. Consequently, data are written to the memory cell.

Figure 8:
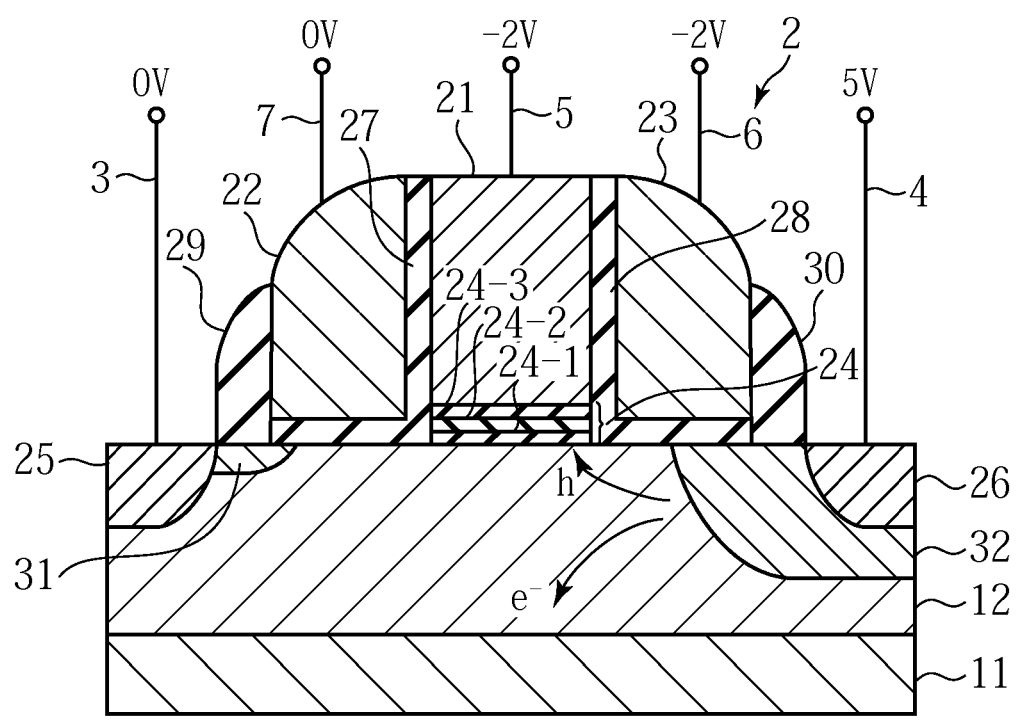
FIG. 8 is a view showing the configuration of the memory cell and a voltage distribution in an erase operation in the first embodiment.

FIG. 8 is a diagram showing the configuration of the memory cell 2 in the present embodiment and the voltage distribution at the time of an erase operation. As shown in FIG. 8, when the erase operation is performed, the voltage applied to each of the gate electrodes is controlled in accordance with the voltage distribution table 38. At the time of the erase operation, the positive voltage of about 5V is applied to the source line 4, and about −2V is applied to the assist gate 23. As shown in FIG. 8, a voltage difference is generated between the second impurity implantation region 32 and the assist gate 23. Then, hot holes generated by the BTBT (Band To Band Tunneling) are injected into the silicon nitride film 24-2 of the charge accumulation layer (ONO film) 24. Consequently, the negative charges accumulated in the silicon nitride film 24-2 of the charge accumulation layer (ONO film) 24 are cancelled, thereby erasing data.

It should be noted that the voltages of the write and erase operations are not limited to the values shown on the voltage distribution table 38. For example, similar to a typical method, the voltages may be changed to adjust the injection positions of the hot electrons and the hot holes. Also, it is allowable to change the voltages of the memory gate 21 and the source line 4 so as to reflect a result of verification, or it is also allowable to change the voltages in a stepwise style during one write or erase operation.

In the memory cell 2 in the present embodiment, the first impurity implantation region 31 in the lower portion of the select gate 22 arranged adjacently to the memory gate 21 is separated by the length of the first length L1 from the intermediate channel region 33. The first impurity implantation region 31 includes the first overlap region 36 whose length is the third length L3. Also, the second impurity implantation region 32 in the lower portion of the assist gate 23 is separated by the second length L2 from the intermediate channel region 33. The second impurity implantation region 32 includes the second overlap region 37 of the fourth length L4.

The first impurity implantation region 31 and the second impurity implantation region 32 in the memory cell 2 are physically separated from the charge accumulation layer (ONO film) 24. For this reason, traps for the carriers in the diffusion layer end portion that causes the retention degradation is difficult to be generated. Also, the excessive charge accumulation layer is not formed between the memory gate 21 and the select gate 22 and between the memory gate 21 and the assist gate 23. Thus, it is possible to suppress the retention degradation caused by the traps to the charge accumulation layer between the gate electrodes.

Moreover, the second impurity implantation region 32 is greatly overlapped with respect to the assist gate 23. Thus, the hot hole erasure using the BTBT (Band To Band Tunneling) can be achieved, thereby reducing the operational voltage at the time of the erase operation.

Figure 9:
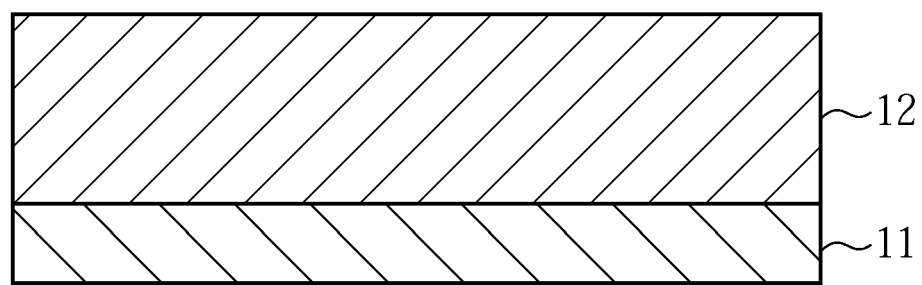
FIG. 9 is a sectional view showing a first stage of a manufacturing method of the memory cell in the first embodiment.

The manufacturing method of the memory cell 2 in the present embodiment will be described below. FIG. 9 is a sectional view showing a first stage in the manufacturing method of the memory cell 2 in the present embodiment. At the first stage, the well 12 is formed in the semiconductor substrate 11. At the step of forming the well 12, preferably, the implantation of $B^+$ in 200 keV is performed in a deep portion to have the density of about 1 to $2 \times E^{13}/cm^2$. Also, preferably, the implantation of $B^+$ in 30 keV is performed in a shallow portion located near the channel to have the density of about 5 to $7 \times E^{12}/cm^2$. The impurities implanted to form the well 12 determine a neutral threshold voltage of the memory gate 21, in the finally-formed memory cell 2.

Figure 10:
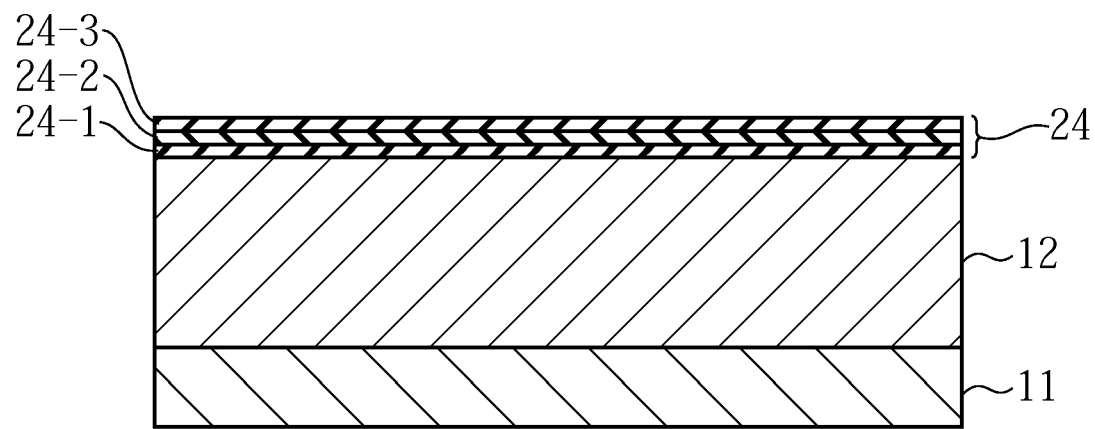
FIG. 10 is a sectional view showing a second stage of the manufacturing method of the memory cell in the first embodiment.

FIG. 10 is a sectional view showing a second stage in the manufacturing method of the memory cell 2. At the second stage, the bottom silicon oxide film 204-1, the silicon nitride film 24-2 and the top silicon oxide film 24-3 are formed in turn on the well 12, and the charge accumulation layer (ONO film) 24 is formed. In the memory cell 2 of the present embodiment, the ONO film is used as the charge accumulation layer. The charge accumulation layer in the memory cell 2 is not limited to the ONO film. Any structure may be employed when it can exhibit the similar function. Materials are preferred to be selected from the viewpoint of the property or on the basis of process integration.

Figure 11:
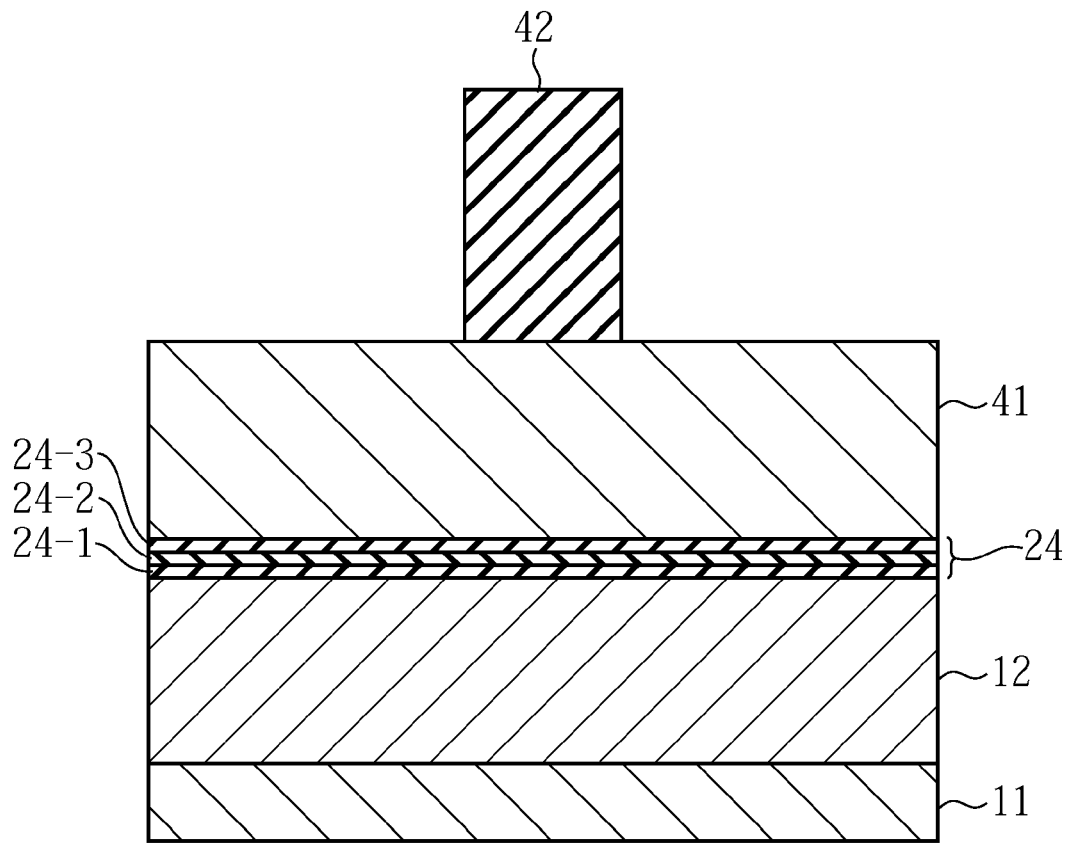
FIG. 11 is a sectional view showing a third stage of the manufacturing method of the memory cell in the first embodiment.

FIG. 11 is a sectional view showing a third stage in the manufacturing method of the memory cell 2. At the third stage, a polysilicon film 41 for the memory gate 21 is formed on the charge accumulation layer (ONO film) 24. After the formation of the polysilicon film 41, a resist 42 is formed at a position corresponding to the memory gate 21 on the polysilicon film 41. Preferably, sufficient impurities are implanted into the polysilicon film 41 by the ion implantation during a film formation step or after a film formation so that it functions as a gate electrode. In a case of the ion implantation, preferably, in the energy of several keV, and impurities of about 1 to $5 \times E^{15}/cm^2$ are implanted.

Figure 12:
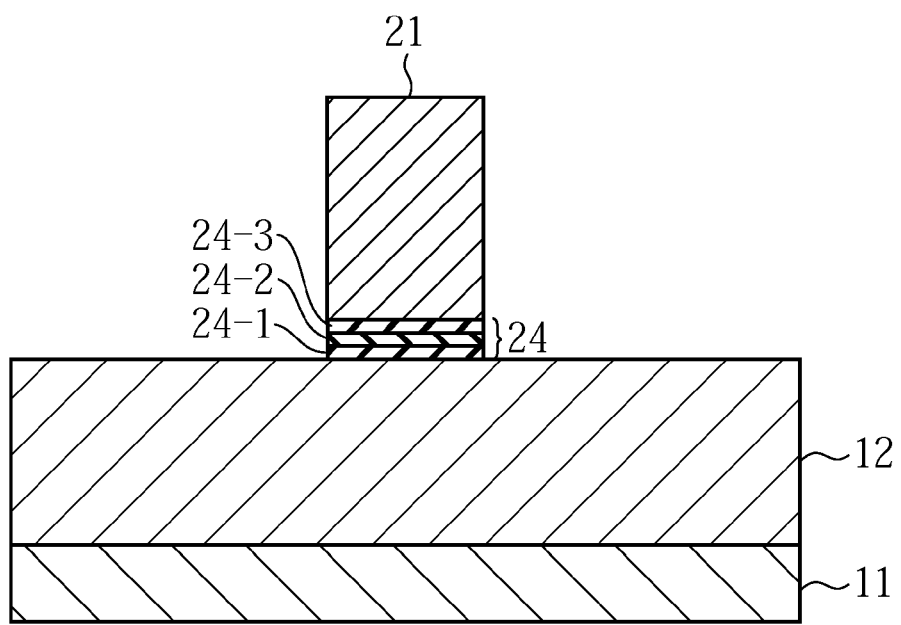
FIG. 12 is a sectional view showing a fourth stage of the manufacturing method of the memory cell in the first embodiment.

FIG. 12 is a sectional view showing a fourth stage in the manufacturing method of the memory cell 2. At the fourth stage, by using the resist 42 as a mask, the polysilicon film 41 is selectively removed. After that, the resist 42 is removed, thereby forming the memory gate 21 patterned by lithography. The memory gate 21 functions as a stopper film for anisotropic etching, and the charge accumulation layer (ONO film) 24 is selectively removed, which partially exposes the well 12.

Figure 13:
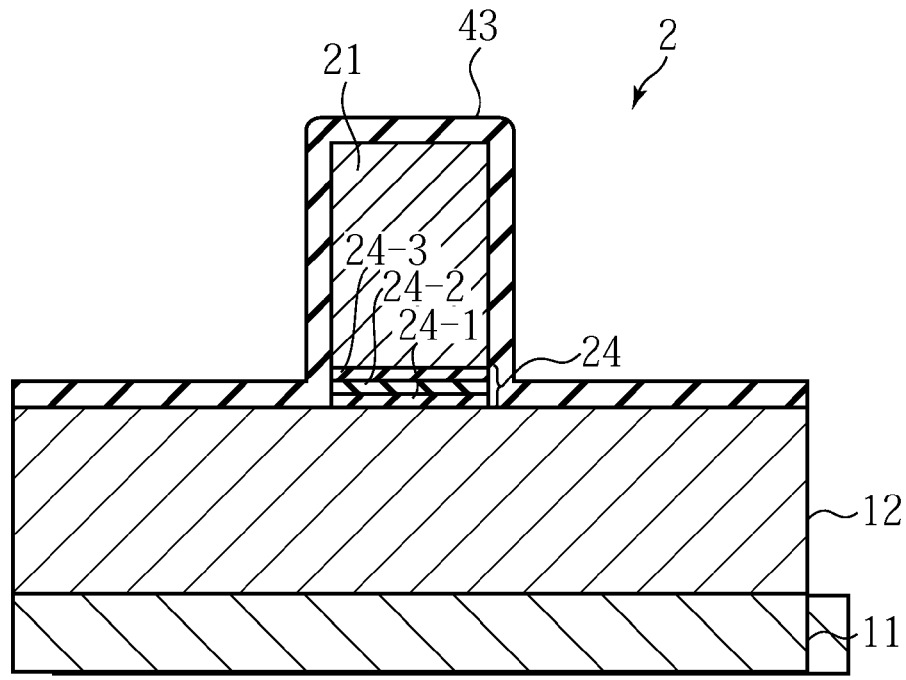
FIG. 13 is a sectional view showing a fifth stage of the manufacturing method of the memory cell in the first embodiment.

FIG. 13 is a sectional view showing a fifth stage in the manufacturing method of the memory cell 2. At the fifth stage, an insulating film 43 is formed to cover the sides of the memory gate 21 and the surface of the exposed well 12. The memory gate 21 and the select gate 22 are finally insulated by the insulating film 43. Also similarly, the memory gate 21 and the assist gate 23 are finally insulated by the insulating film 43. Here, before or after the formation of the insulating film 43, the impurities may be implanted into the well 12. When the impurities are implanted at this stage, the thresholds of the select gate 22 and the assist gate 23 can be finally adjusted in the memory cell 2. It should be noted that in FIG. 13, the detailed explanation of the implantation of the impurities at this stage is omitted, in order to easily understand the memory cell 2 in the present embodiment.

Figure 14:
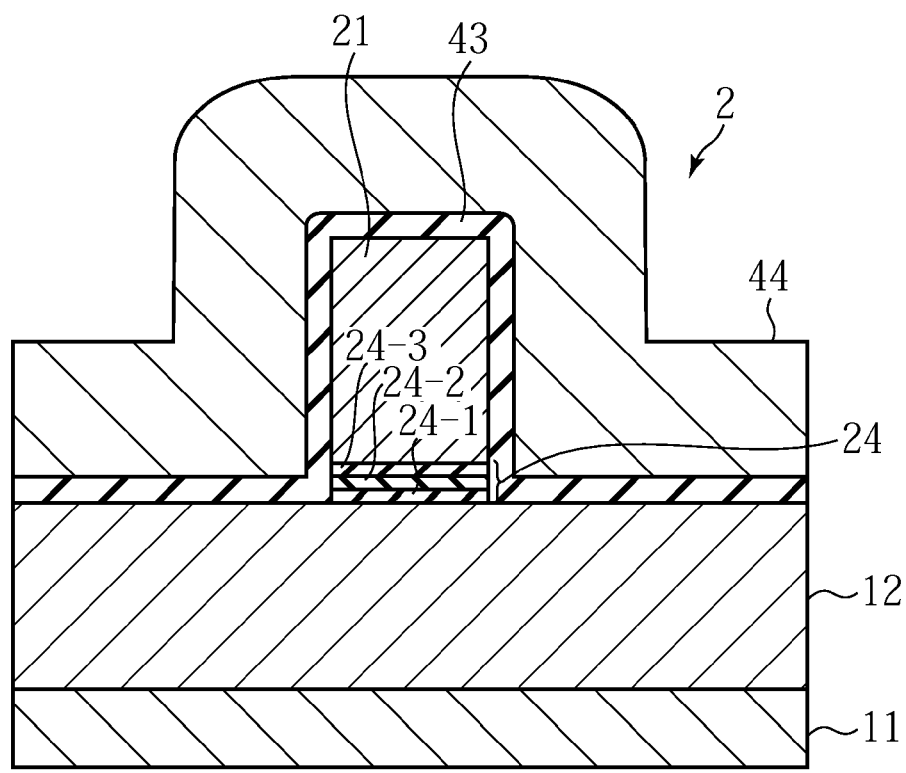
FIG. 14 is a sectional view showing a sixth stage of the manufacturing method of the memory cell in the first embodiment.

FIG. 14 is a sectional view showing a sixth stage in the manufacturing method of the memory cell 2. At the sixth stage, a polysilicon film 44 for sidewall gates to function as the select gate 22 or assist gate 23 is formed on the insulating film 43. At the step of forming the polysilicon film 44 for the sidewall gates, the polysilicon film 44 is preferred to be formed to have the film thickness of about 500 Å(=0.05 μm), in order to set the gate lengths of the finally-formed select gate 22 and assist gate 23 to 0.05 μm. Also, similarly to the formation of the polysilicon film 41 for the memory gate, in order for the select gate 22 and the assist gate 23 to sufficiently function as the gate electrodes, the impurities are preferred to be implanted to have the density of about 1 to $5 \times E^{15}/cm^2$.

Figure 15:
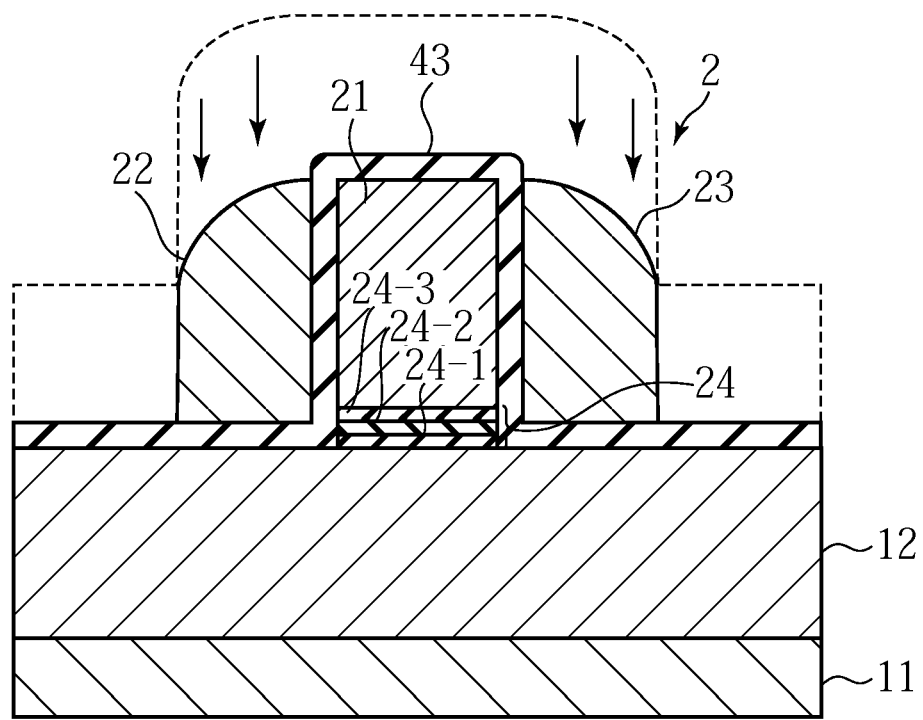
FIG. 15 is a sectional view showing a seventh stage of the manufacturing method of the memory cell in the first embodiment.

FIG. 15 is a sectional view showing a seventh stage in the manufacturing method of the memory cell 2. At the seventh stage, the polysilicon film 44 for the sidewall gates is etched back to form the select gate 22 and the assist gate 23.

Figure 16:
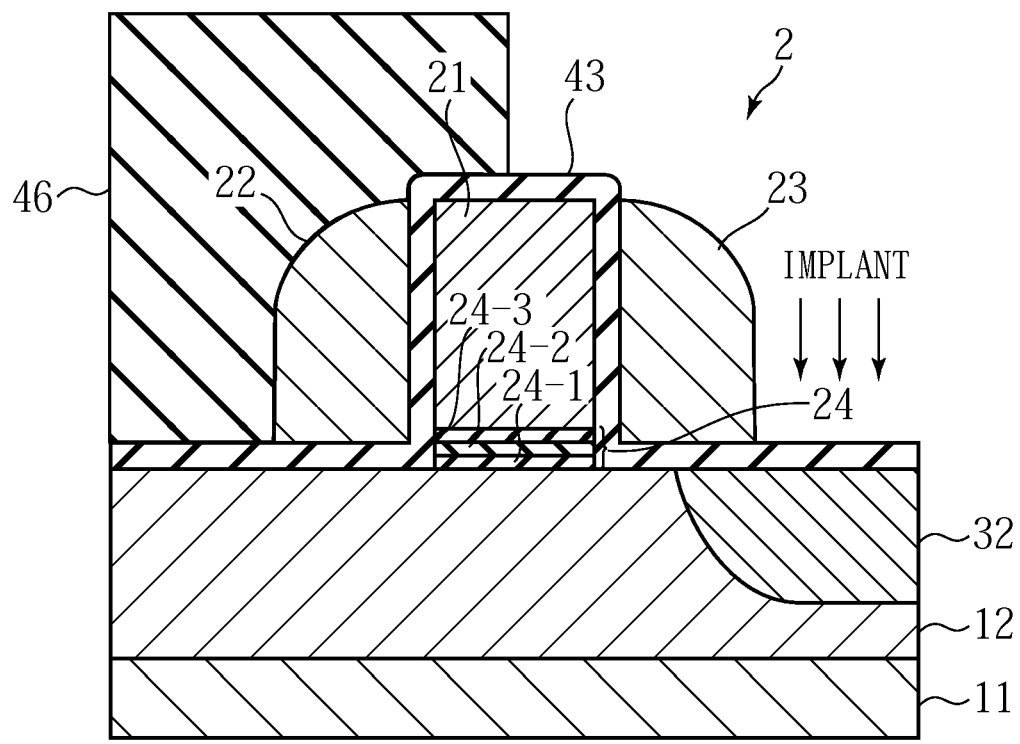
FIG. 16 is a sectional view showing an eighth stage of the manufacturing method of the memory cell in the first embodiment.

FIG. 16 is a sectional view showing an eighth stage in the manufacturing method of the memory cell 2 in the present embodiment. At the eighth stage, a resist 46 is formed to protect a region in which the first impurity implantation region 31 is formed at a later step. Then, for example, the implantation of As in 20 keV is performed in the well 12 that is not covered with the resist 46, to have the density of about $3 \times E^{14}/cm^2$ and the second impurity implantation region 32 is formed.

Figure 17:
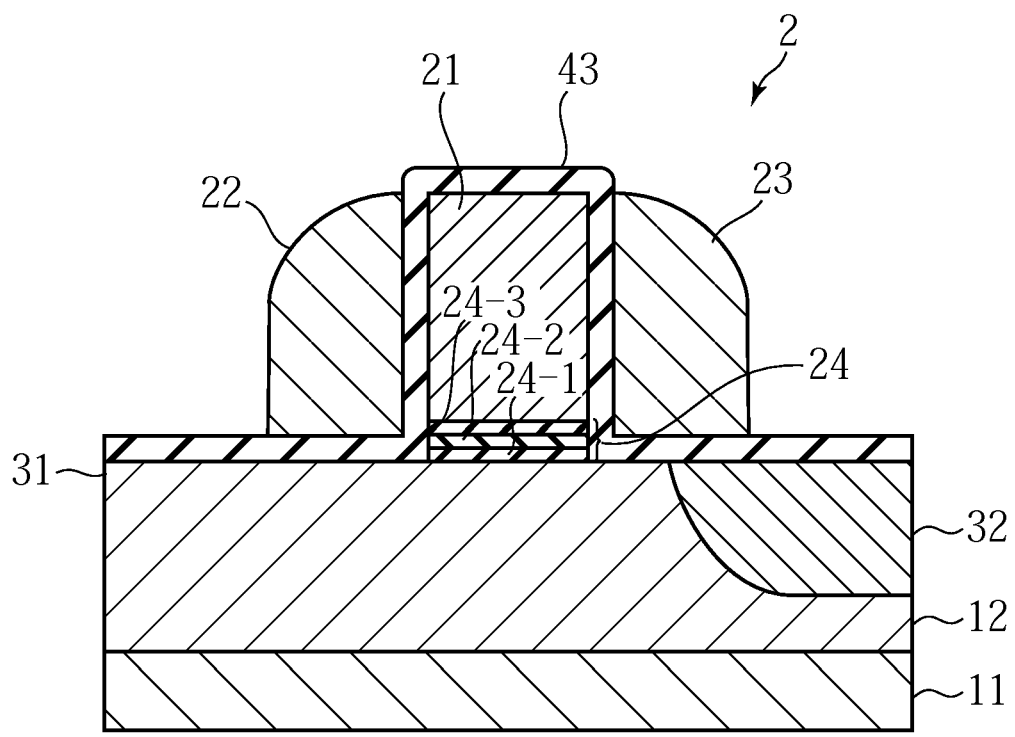
FIG. 17 is a sectional view showing a ninth stage of the manufacturing method of the memory cell in the first embodiment.

FIG. 17 is a sectional view showing a ninth stage in the manufacturing method of the memory cell 2 in the present embodiment. At the ninth stage, the resist 46 is removed to expose a region in which the first impurity implantation region 31 is formed at the later step.

Figure 18:
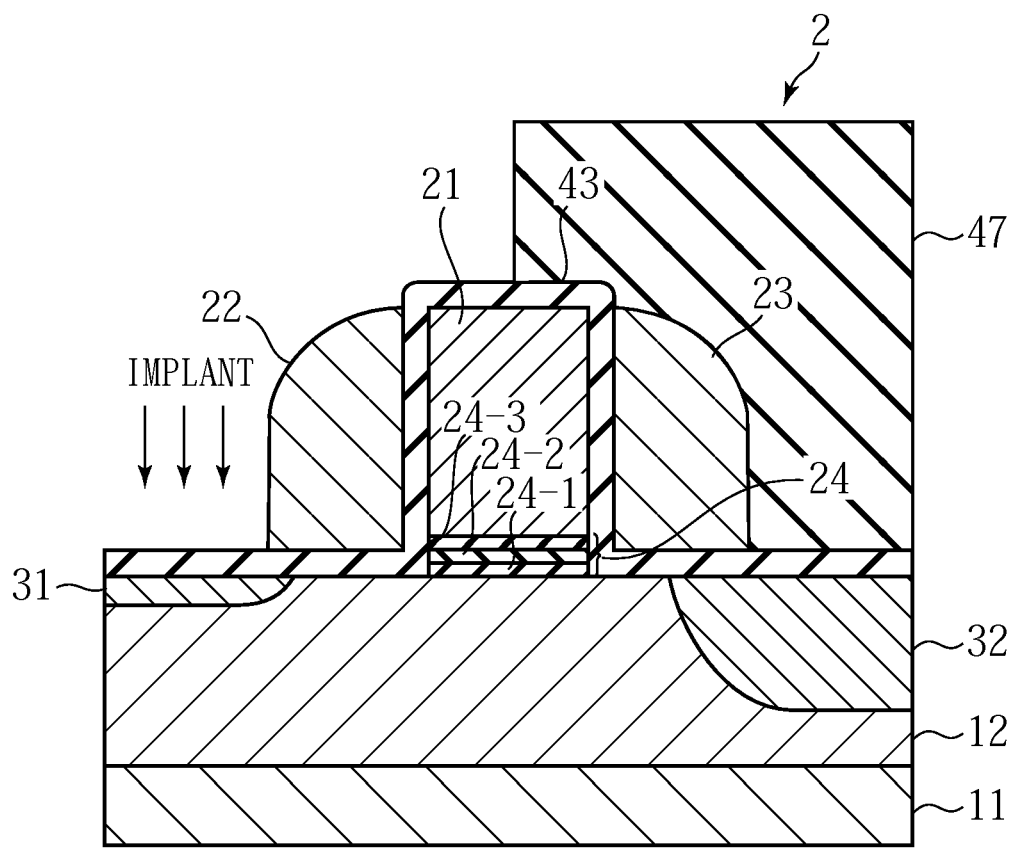
FIG. 18 is a sectional view showing a tenth stage of the manufacturing method of the memory cell in the first embodiment.

FIG. 18 is a sectional view showing a tenth stage in the manufacturing method of the memory cell 2 in the present embodiment. At the tenth stage, a resist 47 is formed to protect the region in which the second impurity implantation region 32 is formed. Then, for example, the implantation of As in 2 keV is performed in the well 12 that is not covered with the resist 47, to have the density of about $5 \times E^{13}/cm^2$, and the first impurity implantation region 31 is formed.

Figure 19:
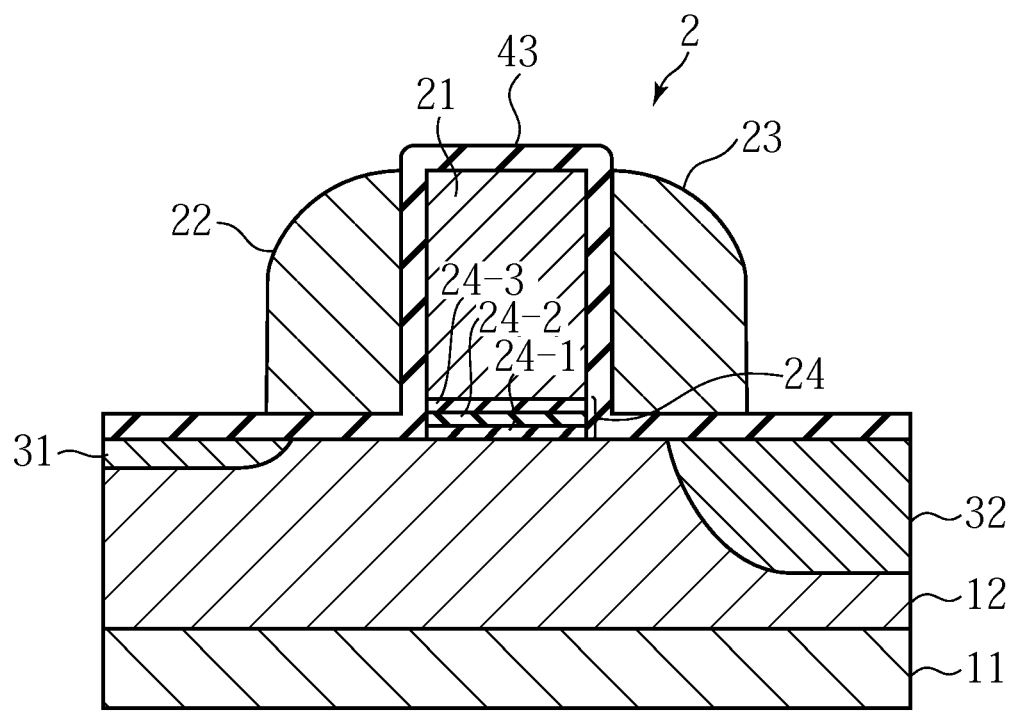
FIG. 19 is a sectional view showing an eleventh stage of the manufacturing method of the memory cell in the first embodiment.

FIG. 19 is a sectional view showing an eleventh stage in the manufacturing method of the memory cell 2. At the eleventh stage, the resist 47 covering the second impurity implantation region 32 is removed. In the memory cell 2 of the present embodiment, a high voltage is applied to the source diffusion layer 26. Also, the select gate 22 on the side of the bit diffusion layer 25 carries out a role as a selector. At the above eighth to eleventh stages, the conditions when the first impurity implantation region 31 and the second impurity implantation region 32 are formed may be changed based on the property of the element.

Figure 20:
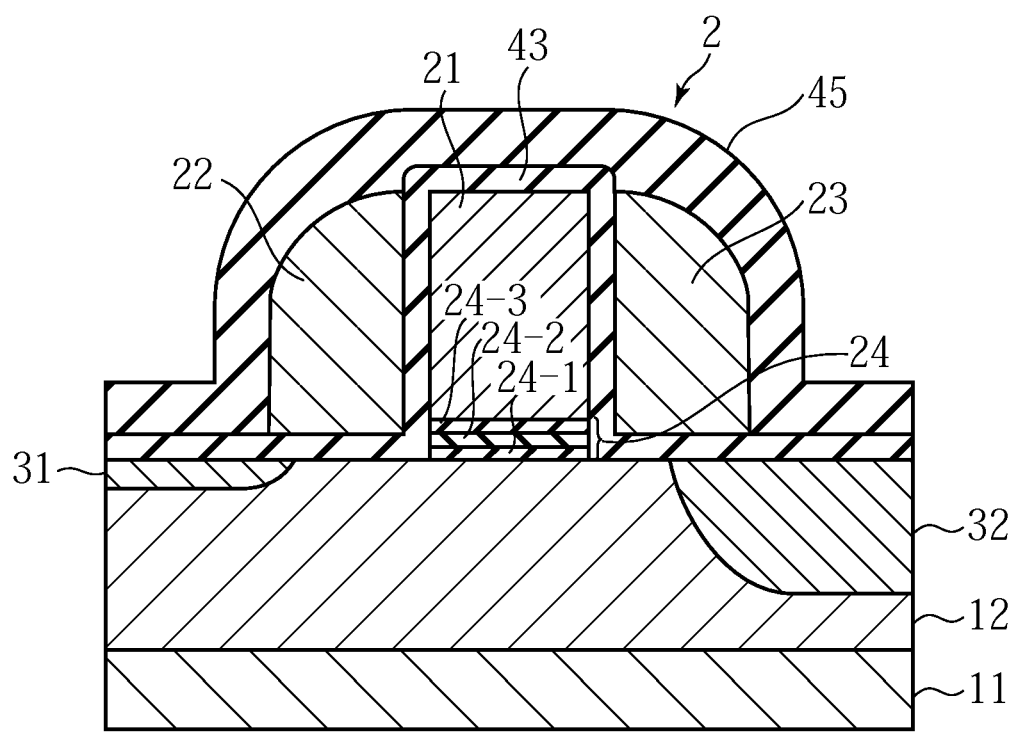
FIG. 20 is a sectional view showing a twelfth stage of the manufacturing method of the memory cell in the first embodiment.
Figure 21:
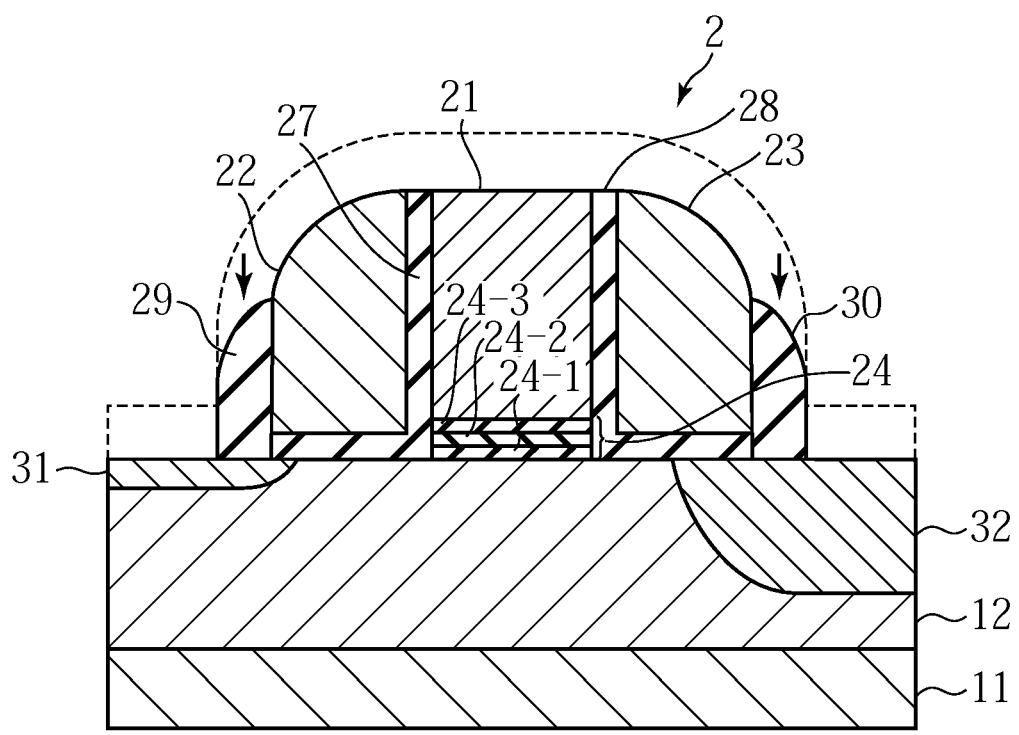
FIG. 21 is a sectional view showing a thirteenth stage of the manufacturing method of the memory cell in the first embodiment.

FIG. 20 is a sectional view showing a twelfth stage in the manufacturing method of the memory cell 2. At the twelfth stage, an insulating film 45 is formed for the sidewall insulating film 29 and the sidewall insulating film 30. FIG. 21 is a sectional view showing a thirteenth stage in the manufacturing method of the memory cell 2. At the thirteenth stage, the insulating film 45 and the insulating film 43 are etched back at a same time, and the sidewall insulating film 29 and the sidewall insulating film 30 are formed. Also, at this time, the insulating film 43 on the memory gate 21 is also removed to expose its surface. The sidewall insulating film 29 outside the select gate 22 and the sidewall insulating film 30 outside the assist gate 23 protect the bridging (short) when silicide layers are formed on the surfaces of the semiconductor substrate and the gate.

Figure 22:
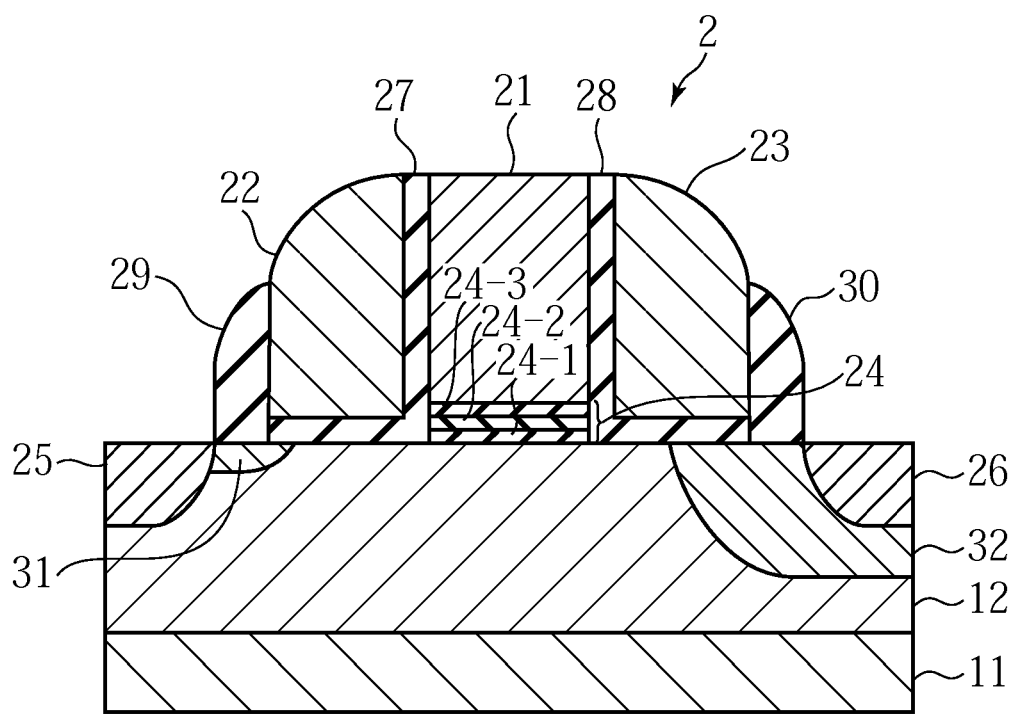
FIG. 22 is a sectional view showing a fourteenth stage of the manufacturing method of the memory cell in the first embodiment.

FIG. 22 is a sectional view showing a fourteenth stage in the manufacturing method of the memory cell 2. At the fourteenth stage, the formed three gates (the memory gate 21, the select gate 22 and the assist gate 23) and the sidewall insulating film 29 and the sidewall insulating film 30 are used as a mask. Then, the bit diffusion layer 25 and the source diffusion layer 26 are formed through the ion implantation. Specifically, the impurities are implanted into the well 12 at the outside of the select gate 22 and the well 12 at the outside of the assist gate 23 at a same time. Consequently, the bit diffusion layer 25 and the source diffusion layer 26 are formed. At the step of forming the bit diffusion layer 25 and the source diffusion layer 26, for example, the implantation of As$^+$ in several key is preferred to be performed to have the density of about $5 \times E^{15}/cm^2$.

As mentioned above, the memory gate 21 formed through the lithography, and the charge accumulation layer (ONO film) 24 between the memory gate 21 and the well 12 (or the substrate) are formed. The select gate 22 and the assist gate 23 are formed adjacently to the memory gate 21. Then, the memory gate 21 and the select gate 22 are insulated by the insulating film 27 different from the charge accumulation layer (ONO film) 24. Similarly, the memory gate 21 and the assist gate 23 are insulated by the insulating film 28 different from the charge accumulation layer (ONO film) 24. The diffusion layer formed outside the select gate 22 is formed to serve as a shallow junction. The diffusion layer outside the assist gate 23 is formed to greatly overlap with the assist gate 23. Consequently, when the memory gate 21 is used as a reference, the asymmetrical memory cell 2 is formed.

The memory cell 2 in the present embodiment achieves the improvement of the retention property and the low operation voltage when the erasure through adoption of the hot hole erasure is carried out. Specifically, in the memory cell 2 of the present embodiment, it is possible to structurally avoid occurrence of a phenomenon referred to as "Mismatching" that results in a factor of the retention degradation. Also, it is possible to carry out the write operation, which uses the channel hot electron injection technique based on the SSI (Source Side Injection), and the hot hole erasure based on the BTBT (Band To Band Tunneling).

Second Embodiment

In the above manufacturing method, the lithography step and the etching step may be added to form the select gate 22 and the assist gate 23 to the sizes different from each other. By changing the sizes of the select gate 22 and the assist gate 23, it is possible to reduce the above "Mismatching" and make the size of the memory cell 2 small while improving the retention property.

Figure 23:
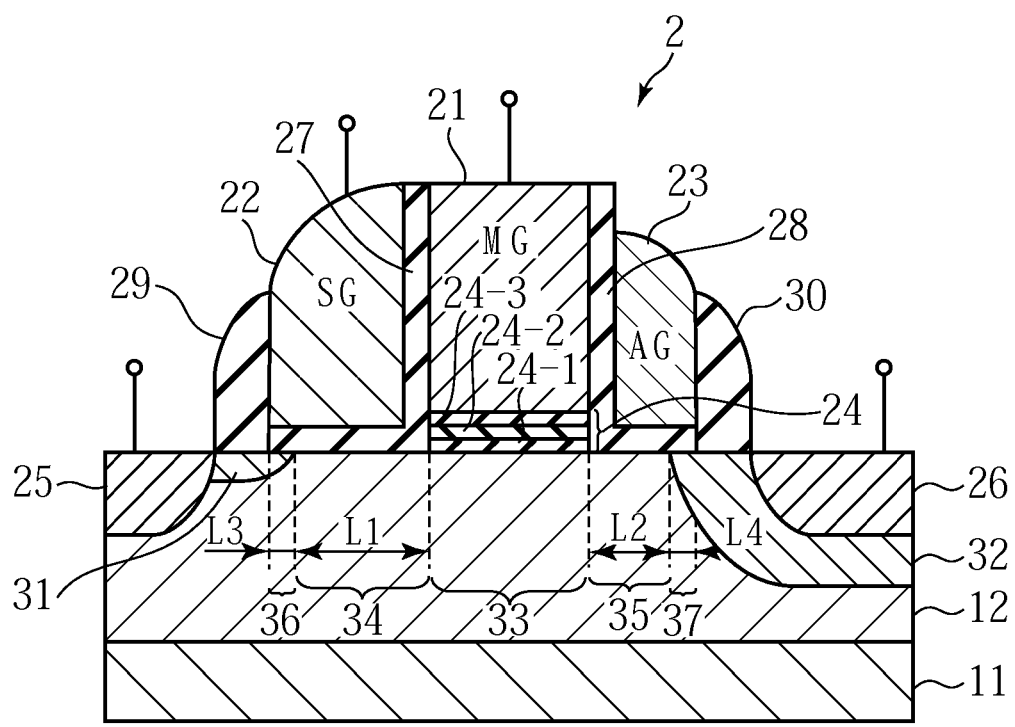
FIG. 23 is a sectional view showing a configuration of a memory cell according to a second embodiment of the present invention.

The second embodiment of the present invention will be described below with reference to the drawings. FIG. 23 is a sectional view showing a configuration of the memory cell 2 in the second embodiment. In the memory cell 2 of the second embodiment, the gate length of the select gate 22 and the gate length of the assist gate 23 differ from each other. By forming the select gate 22 and the assist gate 23 asymmetric, the channel region that satisfies a relation of (First Length L1>Second Length L2) can be formed similarly to the memory cell 2 in the first embodiment. Also, as shown in FIG. 23, in the memory cell 2 of the second embodiment, the first impurity implantation region 31 and the second impurity implantation region 32 are formed to satisfy a relation of (Third Length L3·Fourth Length L4). Since the select gate 22 and the assist gate 23 are shaped as shown in FIG. 23, the memory cell 2 can be configured to have the function similar to that of the memory cell 2 in the first embodiment independently of the third length L3 and the fourth length L4.

Figure 24:
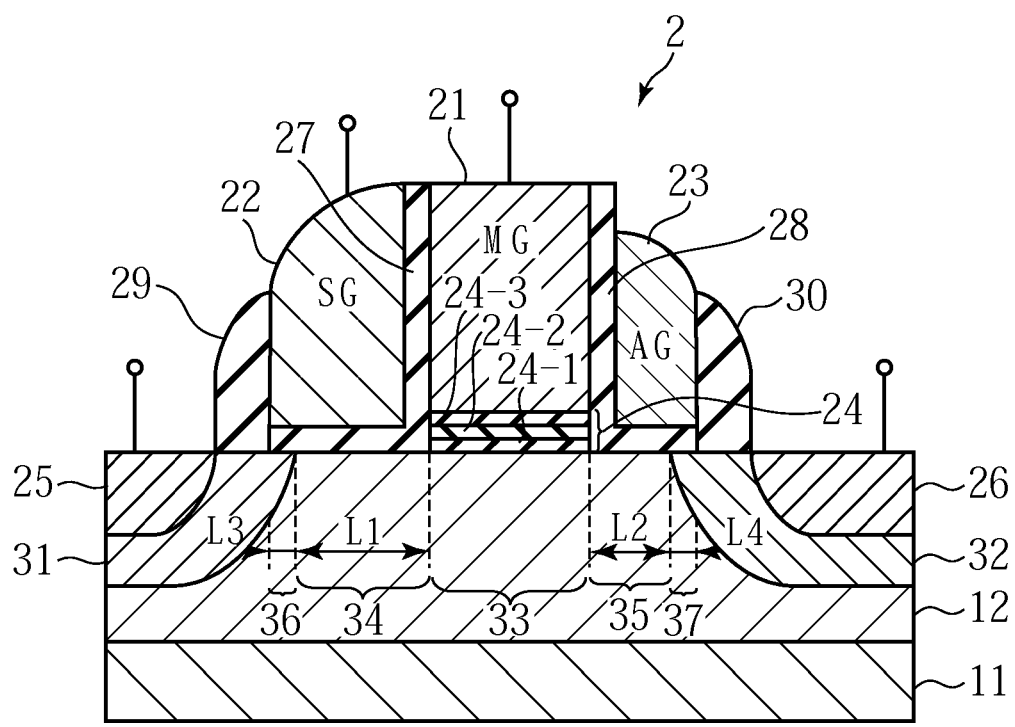
FIG. 24 is a sectional view showing the configuration of the memory cell in the second embodiment.

FIG. 24 is a sectional view showing another configuration of the memory cell 2 in the second embodiment. The memory cell 2 exemplified in FIG. 24 is formed such that the select gate 22 and the assist gate 23 are asymmetric and the first impurity implantation region 31 and the second impurity implantation region 32 are approximately symmetric. Since the first impurity implantation region 31 and the second impurity implantation region 32 are configured as mentioned above, the number of the steps can be reduced when the memory cell 2 in the second embodiment is manufactured.

As mentioned above, the memory cell 2 in the present invention does not depend on the third length L3 of the first overlap region 36 and the fourth length L4 of the second overlap region 37, when the select gate side channel region 34 and the assist gate side channel region 35 are configured to achieve the selection of the memory cell through the use of the select gate, the write operation through the use of the channel hot electron injection, and the hot hole erasure.

As mentioned above, the embodiments of the present invention have been specifically described. However, the present invention is not limited to the above-mentioned embodiments. Various modifications can be made in a range without departing from the scope and spirit thereof. Also, the plurality of embodiments as mentioned above can be embodied by the combination thereof, in a range in which a conflict does not occur in their configurations and operations.

What is claimed is:

1. A non-volatile semiconductor memory device comprising:
    a charge accumulation layer formed on a substrate;
    a memory gate formed onto said substrate through said charge accumulation layer;
    a first side gate formed on a first insulating film, a first portion of the first insulating film extending between the first side gate and a first side of said memory gate, and a second portion of the first insulating film extending between the first side gate and the substrate;
    a second side gate formed on a second insulating film, a first portion of the second insulating film extending between the second side gate and a second side of the memory gate opposite to said first side of the memory gate, and a second portion of the second insulating film extending between the second side gate and the substrate;
    a first impurity implantation region formed in said substrate on a side of said first side gate;
    a second impurity implantation region formed in said substrate on a side of said second side gate; and
    a channel region formed between said first impurity implantation region and said second impurity implantation region,
    wherein said channel region comprises:
    a first region that extends for an entire length of a boundary between said charge accumulation layer and said substrate;
    a select side region that extends from a first end of said first region to an end of said first impurity implantation region; and
    an assist side region that extends from a second end of said first region to an end of said second impurity implantation region, and wherein a length of said select side region is longer than a length of said assist side region.

2. The non-volatile semiconductor memory device according to claim 1, wherein said first side gate has a first gate length and said second side gate has a second gate length which is shorter than the first gate length.

3. The non-volatile semiconductor memory device according to claim 1, wherein said select side region has a sufficient length in a gate length direction to restrain sufficient off leakage in said first side gate,
   wherein said assist side region has a sufficient length in a gate length direction to supply hot holes generated below said second side gate to said charge accumulation layer.

4. The non-volatile semiconductor memory device according to claim 3,
   wherein said first impurity implantation region comprises a first overlap region which overlaps with said first side gate for a first length,
   wherein said second impurity implantation region comprises a second overlap region which overlaps with said second side gate for a second length which is longer than said first length.

5. The non-volatile semiconductor memory device according to claim 3, wherein the hot holes are generated below said second side gate based on a voltage applied to said second impurity implantation region and a voltage applied to said second side gate, and
   wherein the hot holes are injected into said charge accumulation layer to erase data.

6. The non-volatile semiconductor memory device according to claim 5, wherein channel hot electrons are generated based on a voltage applied to said first impurity implantation region and a voltage applied to said second impurity implantation region and are accelerated below said first side gate,
   wherein data is written in said charge accumulation layer by injecting the hot electrons accelerated below said first side gate.

7. The non-volatile semiconductor memory device according to claim 5, wherein data is read based on a drain current flowing from said first impurity implantation region to said second impurity implantation region, by making said first side gate function as a gate electrode of said select transistor.

8. The non-volatile semiconductor memory device according to claim 4,
   wherein said first impurity implantation region contacts a side of a bit diffusion layer, and
   wherein said second impurity implantation region contacts a side and a bottom of a source diffusion layer.

9. The non-volatile semiconductor memory device according to claim 4, wherein said second overlap region provides an effective channel length to supply the hot holes generated below said second side gate to said charge accumulation layer.

10. The non-volatile semiconductor memory device according to claim 4, wherein said first overlap region provides an effective channel length to restrain off leakage in said first side gate.

11. The non-volatile semiconductor memory device according to claim 4,
   wherein said first overlap region is provided at a position of a first depth from a boundary between said substrate and said first insulating film, and has a boundary of said first impurity implantation region and said substrate,
   wherein said second overlap region is provided at a position of a second depth, which is deeper than the first depth, from a boundary of said substrate and said second insulating film, and has a boundary between said second impurity implantation region and said substrate.

* * * * *